(12) United States Patent
Miyazaki et al.

(10) Patent No.: US 11,109,480 B2
(45) Date of Patent: Aug. 31, 2021

(54) FLEXIBLE PRINTED CIRCUIT AND OPTICAL DEVICE

(71) Applicant: Sumitomo Osaka Cement Co., Ltd, Tokyo (JP)

(72) Inventors: Norikazu Miyazaki, Tokyo (JP); Kei Katou, Tokyo (JP); Toshio Kataoka, Tokyo (JP)

(73) Assignee: Sumitomo Osaka Cement Co., Ltd, Tokyo (JP)

( * ) Notice: Subject to any disclaimer, the term of this patent is extended or adjusted under 35 U.S.C. 154(b) by 267 days.

(21) Appl. No.: 16/261,793

(22) Filed: Jan. 30, 2019

(65) Prior Publication Data

US 2019/0239352 A1    Aug. 1, 2019

(30) Foreign Application Priority Data

Jan. 31, 2018 (JP) .............................. JP2018-015778

(51) Int. Cl.
| | |
|---|---|
| *H05K 1/02* | (2006.01) |
| *H05K 1/11* | (2006.01) |
| *H05K 1/18* | (2006.01) |
| *H05K 1/14* | (2006.01) |
| *H04B 10/516* | (2013.01) |
| *G02F 1/01* | (2006.01) |
| *H04B 10/27* | (2013.01) |

(52) U.S. Cl.
CPC ............... *H05K 1/11* (2013.01); *H05K 1/025* (2013.01); *H05K 1/028* (2013.01); *H05K 1/0239* (2013.01); *H05K 1/0243* (2013.01); *H05K 1/14* (2013.01); *H05K 1/181* (2013.01); *G02F 1/0121* (2013.01); *H04B 10/27* (2013.01); *H04B 10/516* (2013.01); *H05K 1/189* (2013.01); *H05K 2201/10121* (2013.01); *H05K 2201/10462* (2013.01)

(58) Field of Classification Search
CPC ............... H05K 1/025–0253; H05K 1/14–148
See application file for complete search history.

(56) References Cited

U.S. PATENT DOCUMENTS

| | | | |
|---|---|---|---|
| 9,535,213 B2 | 1/2017 | Sugiyama | |
| 2014/0085856 A1* | 3/2014 | Shirao | H01P 5/028 361/803 |

FOREIGN PATENT DOCUMENTS

| | | |
|---|---|---|
| JP | 2007123183 A | 5/2007 |
| JP | 2007123744 A | 5/2007 |
| JP | 2015172683 A | 10/2015 |

* cited by examiner

*Primary Examiner* — Jeremy C Norris
(74) *Attorney, Agent, or Firm* — IpHorgan Ltd.

(57) ABSTRACT

A transmission line has a signal electrode formed on one surface of a flexible printed circuit, and a ground electrode formed on the other surface of the flexible printed circuit. A connection terminal has signal terminals formed on both the surfaces of the flexible printed circuit and electrically connected to each other through a via hole, and ground terminals formed on both the surfaces of the flexible printed circuit and electrically connected to each other through the via hole. The signal terminal on the surface, on which the ground electrode is formed, is formed such that at least a width in an end portion on the transmission line side is narrower than a width of a part of the signal terminal on the surface, on which the signal electrode is formed, to be at the same position when the flexible printed circuit is seen in a plan view.

6 Claims, 8 Drawing Sheets

FLEXIBLE PRINTED CIRCUIT AND OPTICAL DEVICE

CROSS-REFERENCE TO RELATED APPLICATIONS

This application claims the benefit of Japanese Patent Application No. 2018-015778 filed Jan. 31, 2018, the disclosure of which is herein incorporated by reference in its entirety.

BACKGROUND OF THE INVENTION

Field of the Invention

The present invention relates to a flexible printed circuit which can be used as a connection interface with respect to an external electric circuit, and an optical device which includes the flexible printed circuit.

Description of Related Art

In an optical communication field, optical devices including an optical control element that controls a light wave by using a high-frequency signal have been utilized. As an example of an optical device, there is an optical modulator in which an optical modulation element modulating a light wave is accommodated inside a housing. For example, the optical modulator is mounted in a transceiver module (transponder). Recently, in accordance with a demand for miniaturization of an optical transmission system, a connection interface portion of the optical modulator with respect to a substrate inside the transponder also tends to be surface-mounting.

As a specific example of a connection interface portion, a lead pin, a flexible printed circuit (FPC), or a field-through structure is used as a surface-mounting interface portion. These interface portions can be directly connected to a circuit of a substrate inside the transponder. Therefore, a coaxial cable used in a push-on coaxial connector or the like is no longer necessary, so that there is an advantage of achieving saving space or cost reduction by reducing the number of components.

FIG. 1 illustrates a state where an optical modulator 2 is disposed on an external substrate 1 (for example, a printed circuit board inside a transponder). In FIG. 1, a flexible printed circuit 3 is used as means for realizing a surface-mounting of a connection interface portion.

FIG. 2 is a view illustrating a cross section of the optical modulator taken along one-dot chain line A-A' in FIG. 1. In the optical modulator 2, an optical modulation element 6 is accommodated inside a metal housing 4 and is closed by a lid 5 to be hermetically sealed. The optical modulation element 6 inside the housing 4 is electrically connected to an electric circuit on the external substrate 1 through a relay substrate 9 disposed inside the housing 4 while being adjacent to the optical modulation element 6, a lead pin 7 disposed in a through-hole of the housing 4, and the flexible printed circuit 3 disposed on a bottom surface of the housing 4. In FIG. 2, the relay substrate 9 and the lead pin 7, and the flexible printed circuit 3 and the lead pin 7 are directly connected to each other by a solder or a brazing material such as AuSn. The relay substrate 9 and the optical modulation element 6 are subjected to bonding-connection using a wire 8 such as a gold wire.

FIGS. 3 and 4 illustrate a flexible printed circuit according to an example in the related art. FIG. 3 illustrates a back surface of the flexible printed circuit, and FIG. 4 illustrates a front surface of the flexible printed circuit. In this specification, the "back surface" indicates a surface on a side facing the external substrate, and the "front surface" indicates a surface on the opposite side thereof. That is, the flexible printed circuit 3 is disposed on the external substrate 1 while the back surface faces down.

A signal electrode 31, a signal terminal 33 connected to the signal electrode 31, and two ground terminals 35 disposed such that the signal terminal 33 is interposed between the ground terminals 35 are formed on one surface (back surface) of the flexible printed circuit 3. In addition, a ground electrode 32, a signal terminal 34, and two ground terminals 36 connected to the ground electrode 32 and disposed such that the signal terminal 34 is interposed between the ground terminals 36 are formed on the other surface of the flexible printed circuit (front surface).

The signal terminal 34 on the front surface and the signal terminal 33 on the back surface are electrically connected to each other through a via hole 38 (through-hole) provided in the flexible printed circuit 3. Similarly, the ground terminals 36 on the front surface and the ground terminals 35 on the back surface are electrically connected to each other through the via hole 38 provided in the flexible printed circuit 3. In this way, a terminal structure, in which terminals on both surfaces of a substrate are connected to each other through a via hole, is used for workability of soldering or prevention of peeling of an electrode in a terminal part. The signal electrode 31 and the ground electrode 32 constitute a transmission line 21 of a microstrip line structure. The signal terminals 33 and 34 and the ground terminals 35 and 36 constitute a connection terminal 22 for electrically connecting the transmission line 21 to a circuit of the external substrate 1.

Since the connection terminal 22 has a terminal structure close to a coplanar line, the connection terminal 22 is configured to be different from the microstrip line structure used in the transmission line 21. Therefore, in a connection portion (a conversion portion of a line structure) with respect to the transmission line 21, deterioration in high-frequency characteristics caused by conversion of the transmission line is generated. Particularly, the influence of a signal terminal formed on the front surface of the flexible printed circuit in which substantially the entire surface serves as a ground electrode cannot be disregarded.

FIG. 5 illustrates a cross section of the flexible printed circuit 3 taken along one-dot chain line B-B' in FIG. 3. In addition, FIG. 6 illustrates a cross section of the flexible printed circuit 3 taken along in one-dot chain line B-B' FIG. 3. In a part of the transmission line 21, as illustrated in FIG. 5, lines of electric force toward the ground electrode 32 on the front surface from the signal electrode 31 on the back surface of the flexible printed circuit 3 are distributed. In contrast, in a part of the connection terminal 22, as illustrated in FIG. 6, lines of electric force toward the ground terminals 35 and 36 on the same surface from the signal terminals 33 and 34 are distributed on both the front surface and the back surface of the flexible printed circuit 3.

In this way, since an electric field profile significantly differs between the connection terminal part and the transmission line part, high-frequency characteristics deteriorate in a connection portion between the connection terminal and the transmission line (a conversion portion of a line structure). Particularly, due to lines of electric force generated from a signal electrode on the front surface including the ground electrode, the lines of electric force are hindered from being directed toward the ground electrode on the opposite side (front surface) from the signal terminal on the back surface including the signal electrode.

Japanese Laid-open Patent Publication No. 2007-123183 discloses a terminal structure in which the widths of signal terminals are equal to each other on both surfaces of a substrate (for example, refer to FIG. 4). In addition, Japanese Laid-open Patent Publication No. 2015-172683 also discloses a structure in which the widths of signal terminals are equal to each other on both surfaces of a substrate (for example, refer to FIG. 4). In addition, Japanese Laid-open Patent Publication No. 2007-123744 discloses a structure in which the width of a signal terminal on a surface (back surface) on a signal electrode side is narrower than that on a surface (front surface) on a ground electrode side (for example, refer to FIG. 9). In Japanese Laid-open Patent Publication No. 2007-123183, Japanese Laid-open Patent Publication No. 2015-172683, and Japanese Laid-open Patent Publication No. 2007-123744, counter measures for deterioration in high-frequency characteristics are not sufficient, and additional improvement is expected.

SUMMARY OF THE INVENTION

An object of the present invention is to solve the problems described above and to suppress deterioration in high-frequency characteristics of a connection portion between a connection terminal and a transmission line in a flexible printed circuit which can be used as a connection interface with respect to an external electric circuit.

According to the present invention, there are provided a flexible printed circuit and an optical device having the following technical features.

(1) A flexible printed circuit includes a transmission line for a high-frequency signal, and a connection terminal for electrically connecting the transmission line to an external electric circuit. The transmission line has a signal electrode formed on one surface of the flexible printed circuit, and a ground electrode formed on the other surface of the flexible printed circuit. The connection terminal has signal terminals formed on both the surfaces of the flexible printed circuit and electrically connected to each other through a via hole, and ground terminals formed on both the surfaces of the flexible printed circuit and electrically connected to each other through the via hole. The signal terminal on the surface, on which the ground electrode is formed, is formed such that at least a width in an end portion on the transmission line side is narrower than a width of a part of the signal terminal on the surface, on which the signal electrode is formed, to be at the same position when the flexible printed circuit is seen in a plan view.

(2) An optical device includes an optical control element that controls a light wave by using a high-frequency signal, and a flexible printed circuit that serves as a connection interface with respect to an external electric circuit. A high-frequency signal is supplied from the external electric circuit to the optical control element through the flexible printed circuit. The flexible printed circuit has a transmission line for a high-frequency signal, and a connection terminal for electrically connecting the transmission line to the external electric circuit. The transmission line has a signal electrode formed on one surface of the flexible printed circuit, and a ground electrode formed on the other surface of the flexible printed circuit. The connection terminal has signal terminals formed on both the surfaces of the flexible printed circuit and electrically connected to each other through a via hole, and ground terminals formed on both the surfaces of the flexible printed circuit and electrically connected to each other through the via hole. The signal terminal on the surface, on which the ground electrode is formed, is formed such that at least a width in an end portion on the transmission line side is narrower than a width of a part of the signal terminal on the surface, on which the signal electrode is formed, to be at the same position when the flexible printed circuit is seen in a plan view.

(3) In the optical device according to (2), the ground terminal on the surface, on which the ground electrode is formed, is formed such that a gap between the ground terminal and the signal terminal on the surface, on which the signal electrode is formed, when the flexible printed circuit is seen in a plan view is narrowed toward the transmission line side.

(4) In the optical device according to (2) or (3), the ground terminal on the surface, on which the signal electrode is formed, is formed such that a gap between the ground terminal and the signal terminal on the same surface is widened toward the transmission line side.

(5) In the optical device according to any one of (2) to (4), the ground terminals on each of the surfaces of the flexible printed circuit are formed such that the signal terminal on the same surface is interposed between the ground terminals.

According to the present invention, it is possible to suppress deterioration in high-frequency characteristics of a connection portion between the connection terminal and the transmission line in the flexible printed circuit which can be used as a connection interface with respect to an external electric circuit.

DETAILED DESCRIPTION OF THE INVENTION

A flexible printed circuit and an optical device according to the present invention will be described. The present invention is not limited to the examples presented in the following embodiments.

Figure 1:
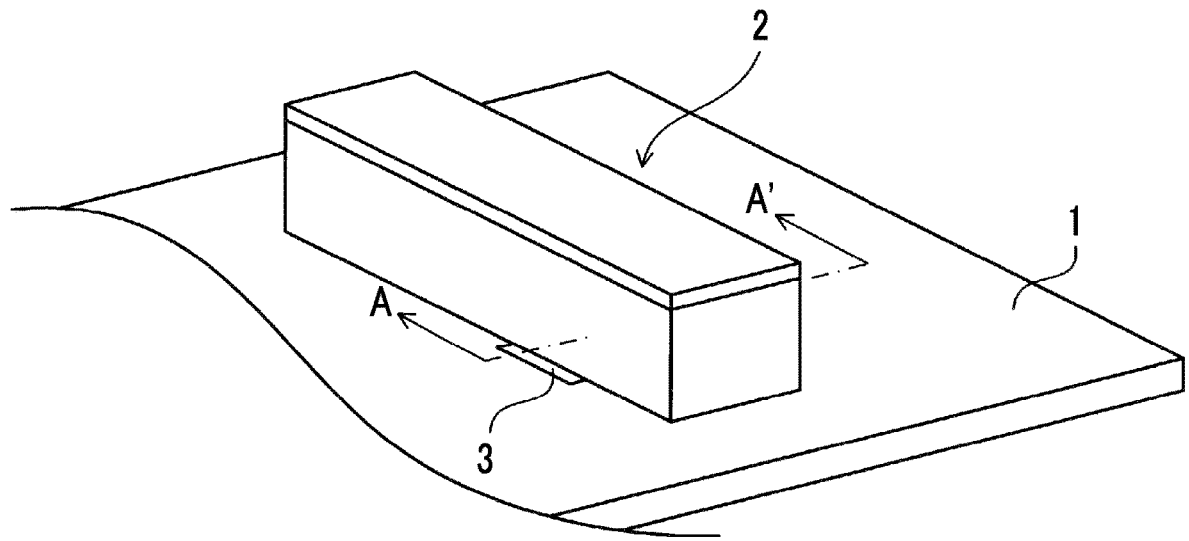
FIG. 1 is a view illustrating a state where an optical modulator is disposed on an external substrate.
Figure 2:
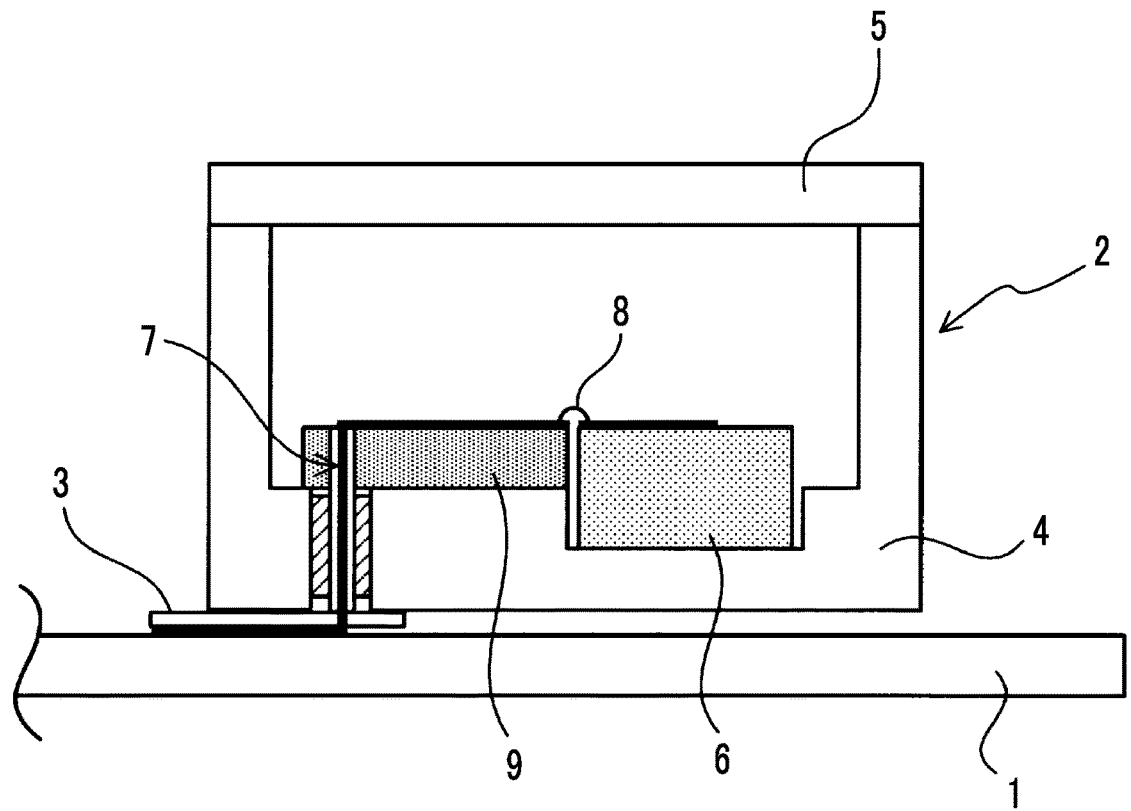
FIG. 2 is a view illustrating a cross section of the optical modulator taken along one-dot chain line A-A' in FIG. 1.
Figure 3:
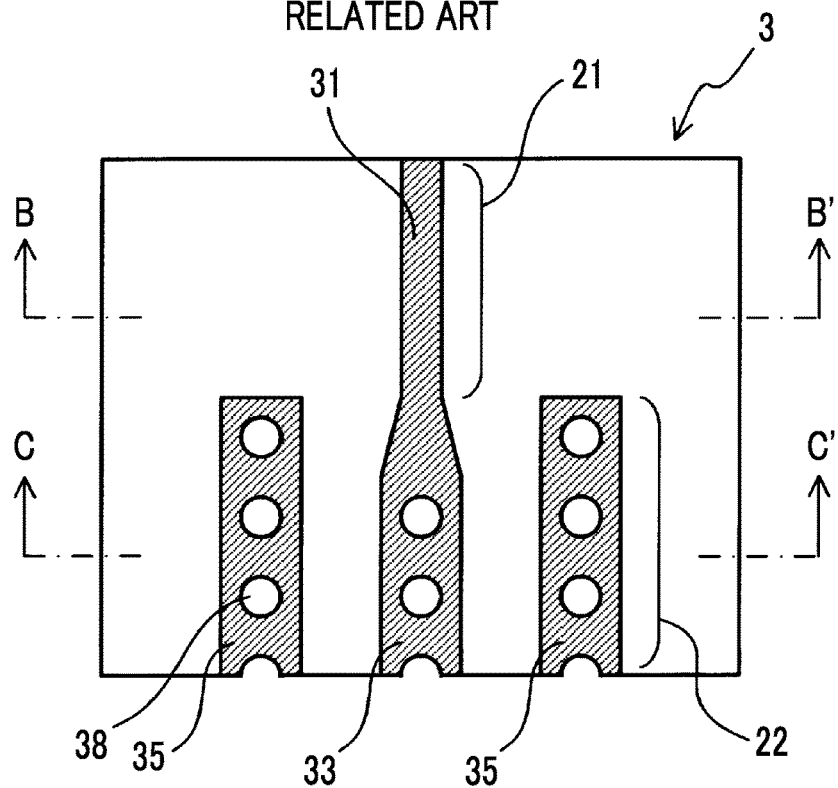
FIG. 3 is a view illustrating a back surface of a flexible printed circuit according to an example in the related art.
Figure 4:
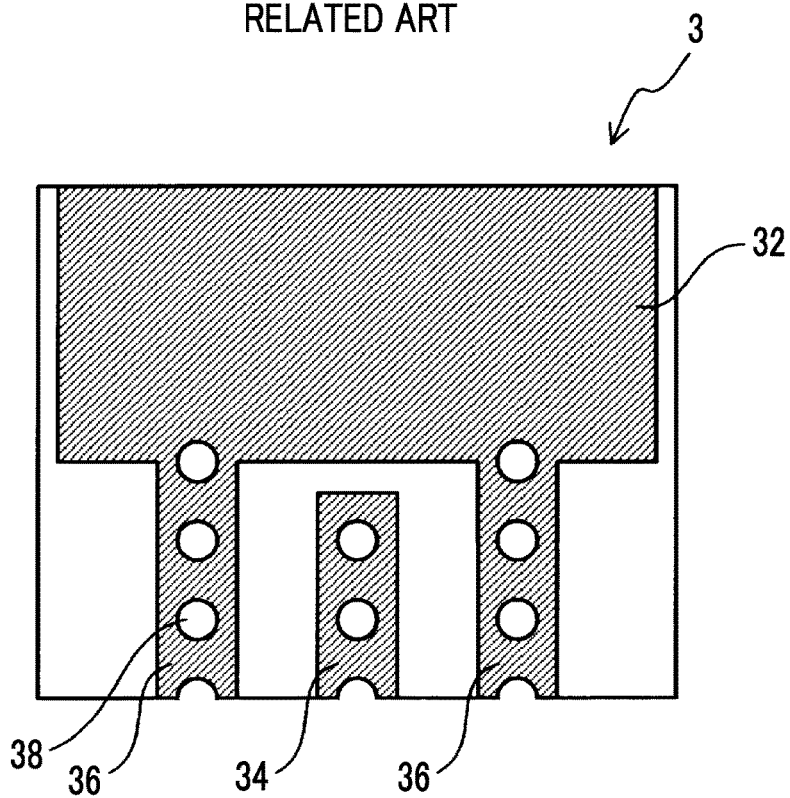
FIG. 4 is a view illustrating a front surface of the flexible printed circuit according to the example in the related art.
Figure 5:
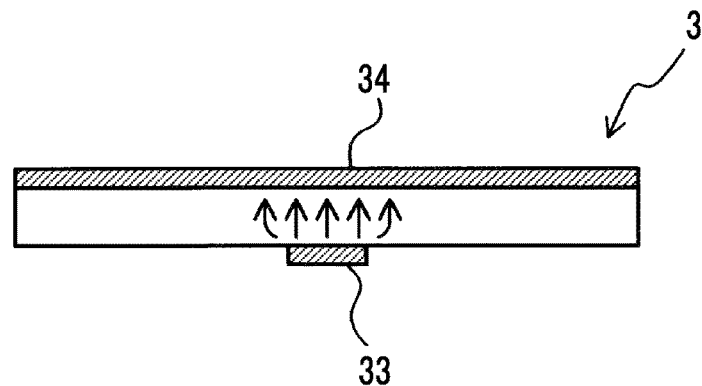
FIG. 5 is a view illustrating a cross section of the flexible printed circuit taken along one-dot chain line B-B' in FIG. 3.
Figure 6:
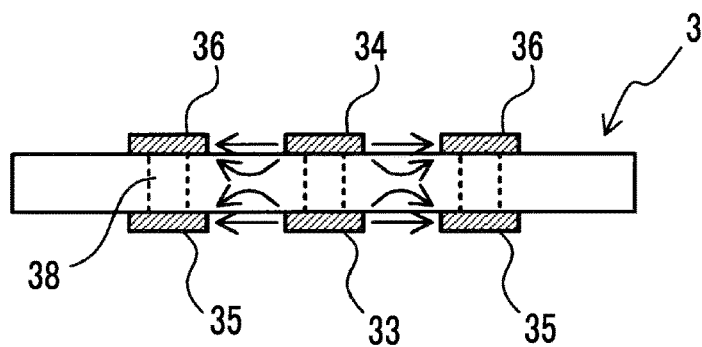
FIG. 6 is a view illustrating a cross section of the flexible printed circuit taken along one-dot chain line C-C' in FIG. 3.
Figure 7:
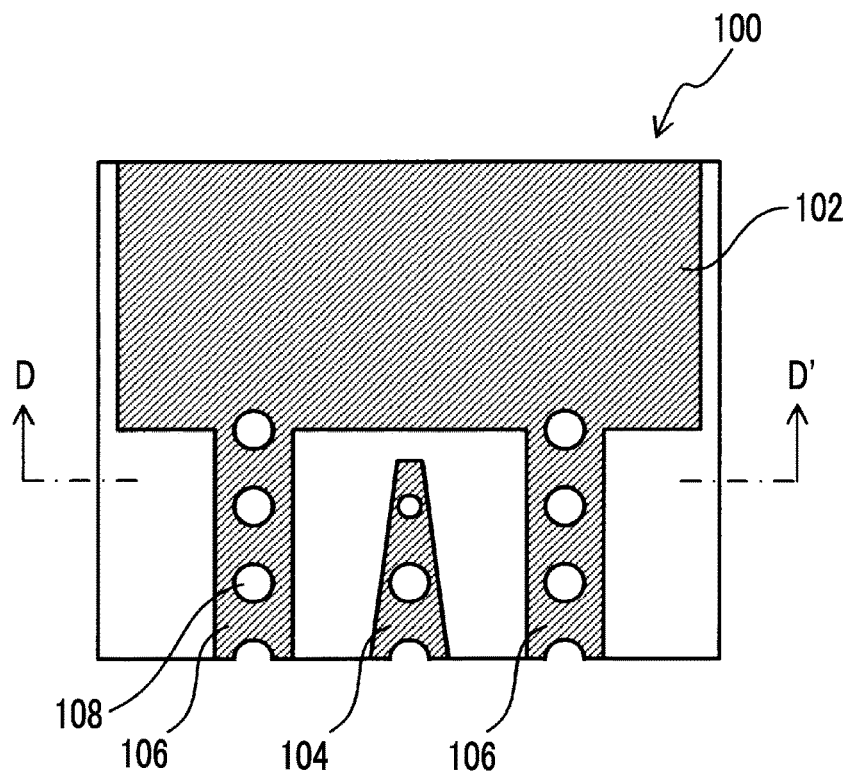
FIG. 7 is a view illustrating a front surface of a flexible printed circuit according to a first embodiment of the present invention.
Figure 8:
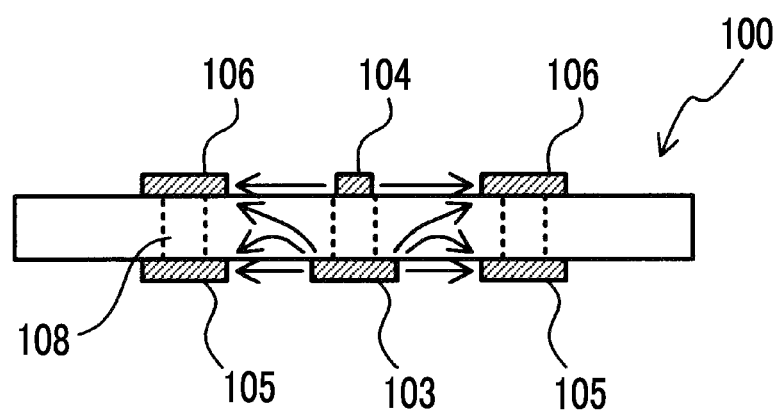
FIG. 8 is a view illustrating a cross section of the flexible printed circuit taken along one-dot chain line D-D' in FIG. 7.

The optical device according to the present invention includes an optical control element (6) that controls a light wave by using a high-frequency signal, and a flexible printed circuit (100) that serves as a connection interface with respect to an external electric circuit (1). A high-frequency signal is supplied from the external electric circuit to the optical control element through the flexible printed circuit. The flexible printed circuit has a transmission line for a high-frequency signal, and a connection terminal for electrically connecting the transmission line to the external electric circuit. For example, as illustrated in FIGS. 7 and 8, the transmission line has a signal electrode formed on one surface of the flexible printed circuit, and a ground electrode (102) formed on the other surface of the flexible printed circuit. In addition, the connection terminal has signal terminals (103, 104) formed on both the surfaces of the flexible printed circuit and electrically connected to each other through a via hole (108), and ground terminals (105, 106) formed on both the surfaces of the flexible printed circuit and electrically connected to each other through the via hole. The signal terminal (104) on the surface, on which the ground electrode is formed, is formed such that at least a width in an end portion on the transmission line side is narrower than a width of apart of the signal terminal on the surface, on which the signal electrode (103) is formed, to be at the same position when the flexible printed circuit is seen in a plan view.

In this way, lines of electric force can be generated toward the ground terminal on the front surface from the signal terminal on the back surface by causing the width of the signal terminal on the front surface including the ground electrode to be narrower than that of the signal terminal on a back surface including the signal electrode in the end portion on the transmission line side. Accordingly, an electric field profile of the connection terminal part can approximate an electric field profile of the transmission line part. Therefore, it is possible to suppress deterioration in high-frequency characteristics of a connection portion between the connection terminal and the transmission line (a conversion portion of a line structure). A part, in which the widths of the signal terminal on the front surface and the signal terminal on the back surface are compared to each other, is a part to be at the same position when the flexible printed circuit is seen in a plan view.

Here, as an example of an optical device, an optical modulator in which an optical modulation element modulating a light wave is accommodated inside a housing is adopted. For example, the optical modulator is mounted inside a transceiver module (transponder). In this case, an electric circuit on a printed circuit board inside the transponder corresponds to the external electric circuit described above. The optical device is not limited to such an optical modulator and can be a device including various optical control elements controlling a light wave by using a high-frequency signal.

In addition, for example, the flexible printed circuit is produced by using a raw material, such as polyimide or a liquid crystal polymer, as a base material (substrate). An electrode pattern on the flexible printed circuit is generally formed of copper foil, and a terminal part is subjected to gold plating or solder plating for soldering or oxidation prevention. Places other than the terminal part are covered with a cover member for protection and peeling prevention of the electrode pattern or for short-circuit prevention.

Hereinafter, a specific configuration of the flexible printed circuit in the optical device according to the present invention will be described based on embodiments.

First Embodiment

FIG. 7 is a view illustrating the front surface of the flexible printed circuit 100 according to a first embodiment. FIG. 8 is a view illustrating a cross section of the flexible printed circuit 100 taken along one-dot chain line D-D' in FIG. 7.

The signal electrode (not illustrated), the signal terminal 103 connected to the signal electrode, and two ground terminals 105, which are disposed such that the signal terminal 103 is interposed between ground terminals 105, are formed on one surface (back surface) of a flexible printed circuit 3. In addition, the ground electrode 102, the signal terminal 104, and two ground terminals 36, which are connected to the ground electrode 102 and are disposed such that the signal terminal 104 is interposed between ground terminals 36, are formed on the other surface of the flexible printed circuit (front surface).

The signal terminal 104 on the front surface and the signal terminal 103 on the back surface are electrically connected to each other through the via hole 108 (through-hole) provided in the flexible printed circuit 100. Similarly, the ground terminal 106 on the front surface and the ground terminal 105 on the back surface are also electrically connected to each other through the via hole 108 provided in the flexible printed circuit 100. A terminal structure in which terminals on both surfaces of a substrate are connected to each other through a via hole in this way is used for workability of soldering or prevention of peeling of the electrode in the terminal part. The signal electrode (not illustrated) and the ground electrode 102 constitute a transmission line of a microstrip line structure. The signal terminals 103 and 104 and the ground terminals 105 and 106 constitute a transmission line for electrically connecting the connection terminal to the external electric circuit.

The signal terminal 104 on the front surface including the ground electrode 102 is formed such that the width is gradually narrowed toward the end portion on the transmission line side throughout its entirety in a length direction (a direction toward the transmission line). As a result, lines of electric force generated from the signal terminal 104 on the front surface are reduced while being closer to the transmission line side. Accordingly, as illustrated in FIG. 8, in the vicinity of the end portion on the transmission line side, lines of electric force can be generated toward the ground terminal 106 on the front surface from the signal terminal 103 on the back surface. In this way, since the signal terminal 104 on the front surface is formed such that the width in the vicinity of the end portion on the transmission line side is narrowed, it is possible to restrain the influence of the signal terminal 104 in the connection portion between the connection terminal and the transmission line, and it is possible to achieve an effect of suppressing deterioration in high-frequency characteristics caused by conversion of the transmission line.

In addition, the signal terminal 104 on the front surface has a width narrower than that of the signal terminal 103 on the back surface while being closer to the transmission line side. Therefore, lines of electric force generated from the signal terminal 104 on the front surface are reduced, and an operation of generating lines of electric force toward the ground terminal 106 on the front surface from the signal terminal 103 on the back surface is enhanced. As a result, it is possible to more effectively suppress deterioration in high-frequency characteristics caused by conversion of the transmission line.

In addition, in the signal terminal 104 on the front surface including the ground electrode 102, the width in the end portion on the transmission line side is narrower than that in the end portion on a side opposite to the transmission line on the same surface. In other words, in the signal terminal 104, the width in the end portion on a side opposite to the transmission line is wider than that in the end portion on the transmission line side on the same surface. Accordingly, a wide terminal width can be ensured in at least the end portion on a side opposite to the transmission line. Thus, peeling of the electrode in the terminal part is unlikely to occur.

Second Embodiment

Figure 9:
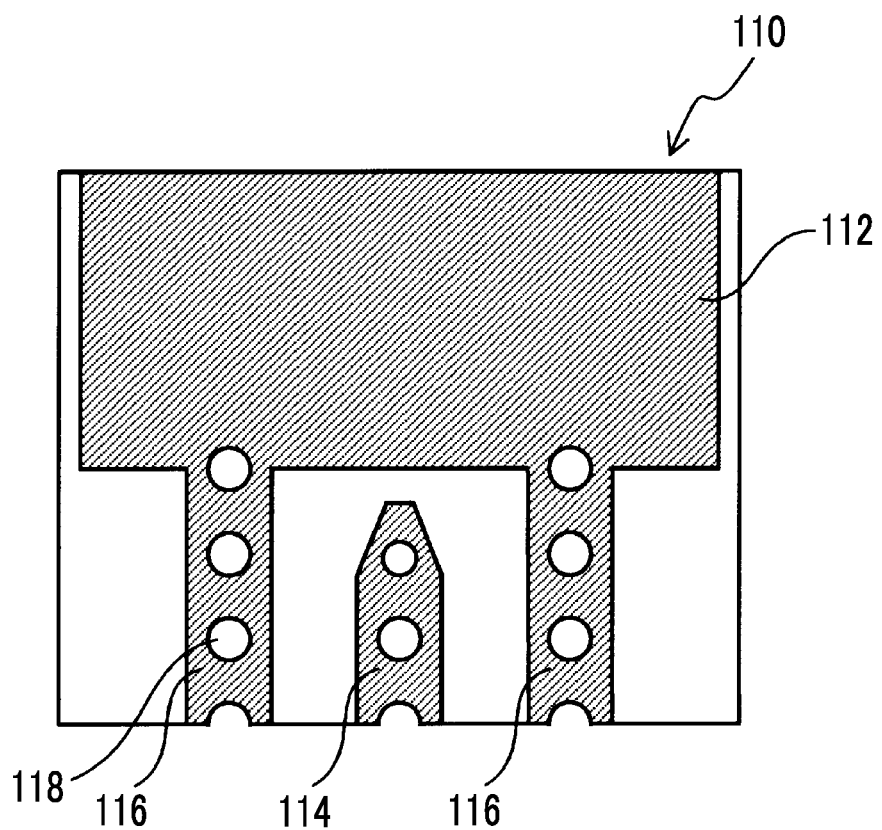
FIG. 9 is a view illustrating a front surface of a flexible printed circuit according to a second embodiment of the present invention.

FIG. 9 is a view illustrating a front surface of a flexible printed circuit 110 according to a second embodiment. Here, for simple description, main parts different from those of the first embodiment will be described.

In the first embodiment, the signal terminal 104 on the front surface including the ground electrode 102 is formed such that the width is gradually narrowed toward the end portion on the transmission line side throughout its entirety in the length direction. In contrast, in the second embodiment, a signal terminal 114 on the front surface including a ground electrode 112 is formed such that the width is gradually narrowed toward in the vicinity of the end portion on the transmission line side. That is, the width of the signal terminal 114 is narrower than that of the signal terminal on the back surface, on which the signal electrode is formed, in the vicinity of the end portion on the transmission line side. Even in such a form, since lines of electric force can be generated toward the ground terminal on the front surface from the signal terminal on the back surface before reaching the connection portion between the connection terminal and the transmission line, deterioration in high-frequency characteristics of the connection portion between the connection terminal and the transmission line is suppressed. In addition, since the width of the signal terminal 114 on the front surface can be wider than that in the first embodiment (FIG. 7), a size of a via hole 118 connecting the signal terminal 114 on the front surface and the signal terminal (not illustrated) on the back surface can be increased. Accordingly, peeling of the electrode in the terminal part is less likely to occur. Furthermore, since electrical connection between the front and back terminals becomes firm, deterioration in high-frequency characteristics caused by generation of a potential difference between the front and back terminals is unlikely to occur.

Third Embodiment

Figure 10:
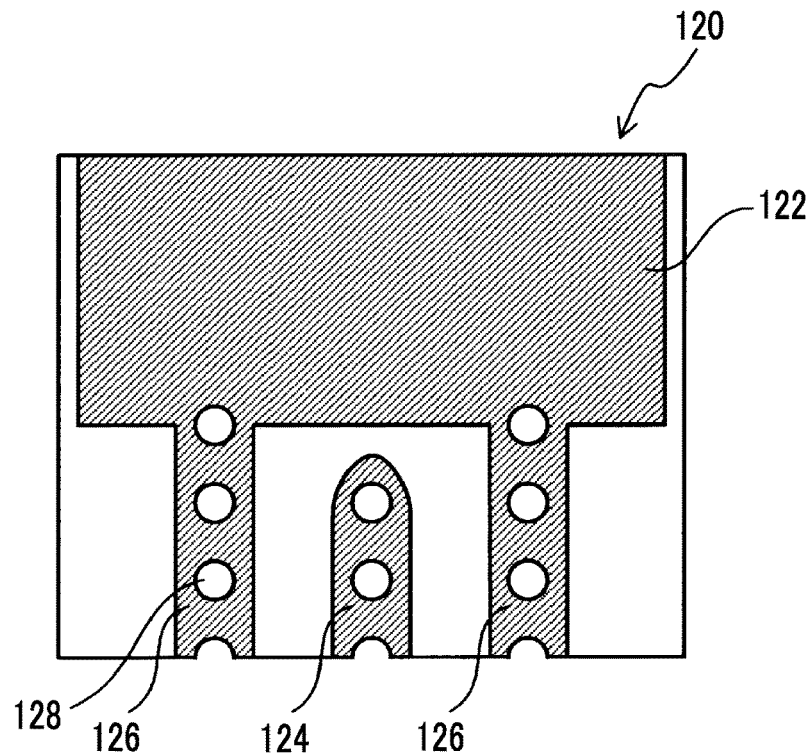
FIG. 10 is a view illustrating a front surface of a flexible printed circuit according to a third embodiment of the present invention.

FIG. 10 is a view illustrating a front surface of a flexible printed circuit 120 according to a third embodiment. Here, for simple description, main parts different from those of the second embodiment will be described.

In the second embodiment, the signal terminal 114 on the front surface including the ground electrode 112 is formed such that the width is narrowed in a linear way toward the end portion on the transmission line side in the vicinity of the end portion on the transmission line side. In contrast, in the third embodiment, a signal terminal 124 on the front surface including a ground electrode 122 is formed such that the width is narrowed in a curved way toward the end portion on the transmission line side in the vicinity of the end portion on the transmission line side. Even in such a form, since lines of electric force can be generated toward the ground terminal on the front surface from the signal terminal on the back surface before reaching the connection portion between the connection terminal and the transmission line, deterioration in high-frequency characteristics of the connection portion between the connection terminal and the transmission line is suppressed. In addition, since the end portion of the signal terminal 124 on the front surface on the transmission line side is formed to have an arc shape, a size of a via hole 128 near the transmission line can also be increased. Accordingly, electrical connection between the front and back terminals becomes more firm, and deterioration in high-frequency characteristics caused by generation of a potential difference between the front and back terminals can be further suppressed.

Fourth Embodiment

Figure 11:
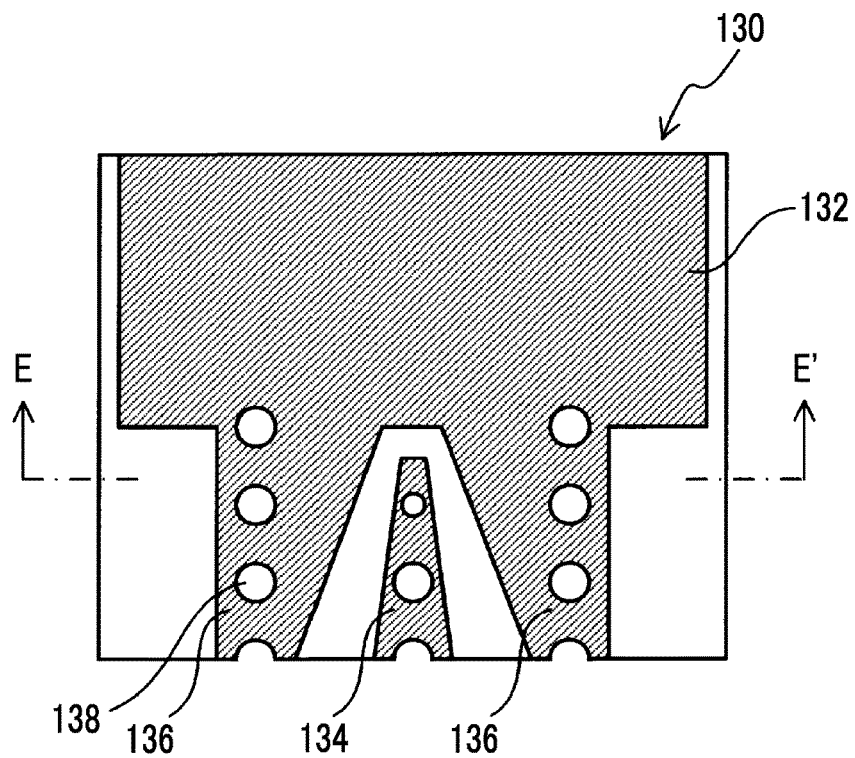
FIG. 11 is a view illustrating a front surface of a flexible printed circuit according to a fourth embodiment of the present invention.
Figure 12:
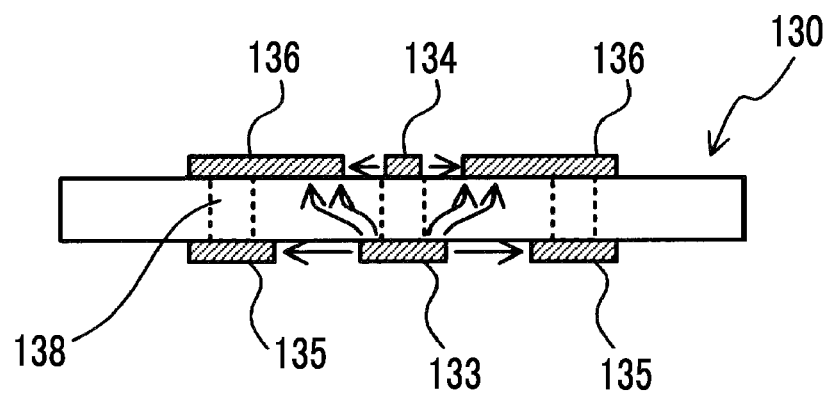
FIG. 12 is a view illustrating a cross section of the flexible printed circuit taken along one-dot chain line E-E' in FIG. 11.

FIG. 11 is a view illustrating a front surface of a flexible printed circuit 130 according to a fourth embodiment. FIG. 12 is a view illustrating a cross section of the flexible printed circuit 130 taken along one-dot chain line E-E' in FIG. 11. Here, for simple description, main parts different from those of the first embodiment will be described.

In the first embodiment, the signal terminal 104 on the front surface including the ground electrode 102 is formed such that the width is gradually narrowed toward the end portion on the transmission line side throughout its entirety in the length direction. On the other hand, two ground terminals 106 on the same surface (front surface) are formed such that the gap therebetween becomes uniform. In contrast, in the fourth embodiment, a signal terminal 134 on the front surface including a ground electrode 132 is formed such that the width is gradually narrowed toward the end portion on the transmission line side throughout its entirety in the length direction. In addition, two ground terminals 136 on the same surface (front surface) are also formed such that the gap therebetween is gradually narrowed toward the end portion on the transmission line side throughout its entirety in the length direction. Moreover, the narrowing way of the gap between the ground terminals 136 is greater than the narrowing way of the width of the signal terminal 134. That is, the gap between the ground terminals 136 and the signal terminal 134 is gradually narrowed toward the transmission line side. In addition, since the width of a signal terminal 133 on the back surface including the signal electrode is uniform, the gap between the signal terminal 133 on the back surface and the ground terminals 136 on the front surface is gradually narrowed toward the transmission line side when the flexible printed circuit 130 is seen in a plan view. Furthermore, the narrowing way of the gap between the signal terminal 133 on the back surface and the ground terminals 136 on the front surface becomes greater than the narrowing way of the gap between the signal terminal 134 on the front surface and the ground terminals 136 on the front surface. Therefore, as illustrated in FIG. 12, lines of electric force toward the ground terminals 136 on the front surface from the signal terminal 133 on the back surface can be further increased. Accordingly, deterioration in high-frequency characteristics of the connection portion between the connection terminal and the transmission line can be further suppressed.

Fifth Embodiment

Figure 13:
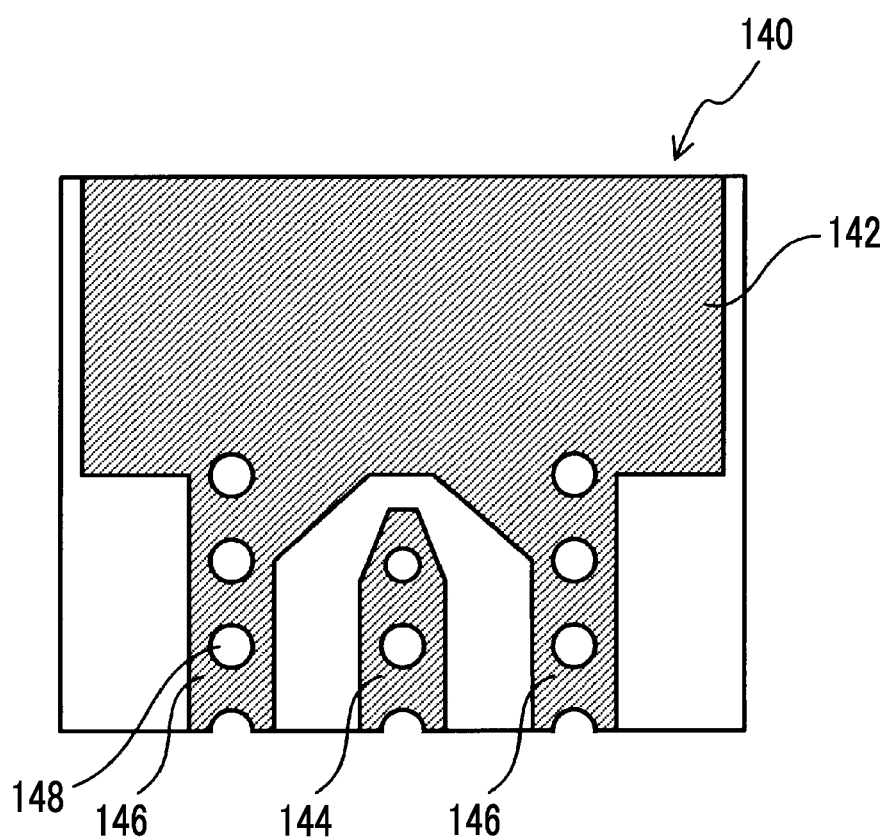
FIG. 13 is a view illustrating a front surface of a flexible printed circuit according to a fifth embodiment of the present invention.

FIG. 13 is a view illustrating a front surface of a flexible printed circuit 140 according to a fifth embodiment. Here, for simple description, main parts different from those of the second embodiment will be described.

In the second embodiment, the signal terminal 114 on the front surface including the ground electrode 112 is formed such that the width is gradually narrowed toward the end portion on the transmission line side in the vicinity of the end portion on the transmission line side. On the other hand, two ground terminals 116 on the same surface (front surface) are formed such that the gap therebetween becomes uniform. In contrast, in the fifth embodiment, a signal terminal 144 on the front surface including a ground electrode 142 is formed such that the width is gradually narrowed toward the end portion on the transmission line side in the vicinity of the end portion on the transmission line side. In addition, two ground terminals 146 on the same surface (front surface) are also formed such that the width is gradually narrowed toward the end portion on the transmission line side in the vicinity of the end portion on the transmission line side. Moreover, the narrowing way of the gap between the ground terminals 146 is greater the narrowing way of the width of the signal terminal 144. Even in such a form, the gap between the signal terminal on the back surface including the signal electrode and the ground terminals 146 on the front surface is gradually narrowed toward the transmission line side. Therefore, since lines of electric force toward the ground terminal on the front surface from the signal terminal on the back surface can be further increased, deterioration in high-frequency characteristics of the connection portion between the connection terminal and the transmission line is suppressed.

Sixth Embodiment

Figure 14:
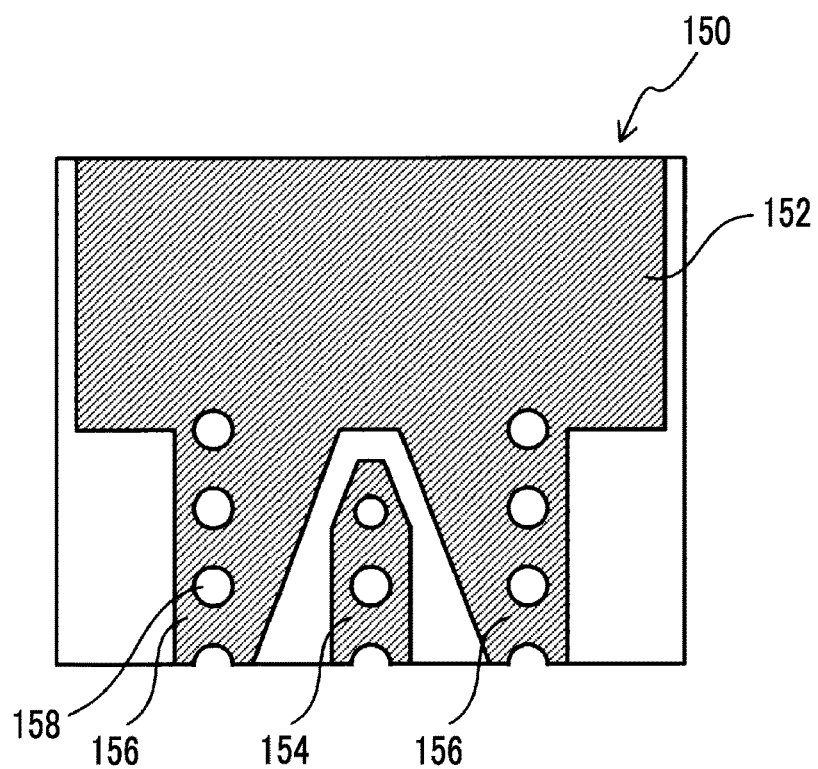
FIG. 14 is a view illustrating a front surface of a flexible printed circuit according to a sixth embodiment of the present invention.

FIG. 14 is a view illustrating a front surface of a flexible printed circuit 150 according to a sixth embodiment. Here, for simple description, main parts different from those of the fifth embodiment will be described.

In the fifth embodiment, the signal terminal 144 on the front surface including the ground electrode 142 is formed such that the width is gradually narrowed toward the end portion on the transmission line side in the vicinity of the end portion on the transmission line side. In addition, two ground terminals 146 on the same surface (front surface) are formed such that the width is gradually narrowed toward the end portion on the transmission line side in the vicinity of the end portion on the transmission line side. In contrast, in the sixth embodiment, a signal terminal 154 on the front surface including a ground electrode 152 is formed such that the width is gradually narrowed toward the end portion on the transmission line side in the vicinity of the end portion on the transmission line side. On the other hand, two ground terminals 156 on the same surface (front surface) are formed such that the gap therebetween is gradually narrowed toward the end portion on the transmission line side throughout its entirety in the length direction. Even in such a form, the gap between the signal terminal on the back surface including the signal electrode and the ground terminals 156 on the front surface is gradually narrowed toward the transmission line side. Therefore, since lines of electric force toward the ground terminal on the front surface from the signal terminal on the back surface can be further increased, deterioration in high-frequency characteristics of the connection portion between the connection terminal and the transmission line is suppressed.

Seventh Embodiment

Figure 15:
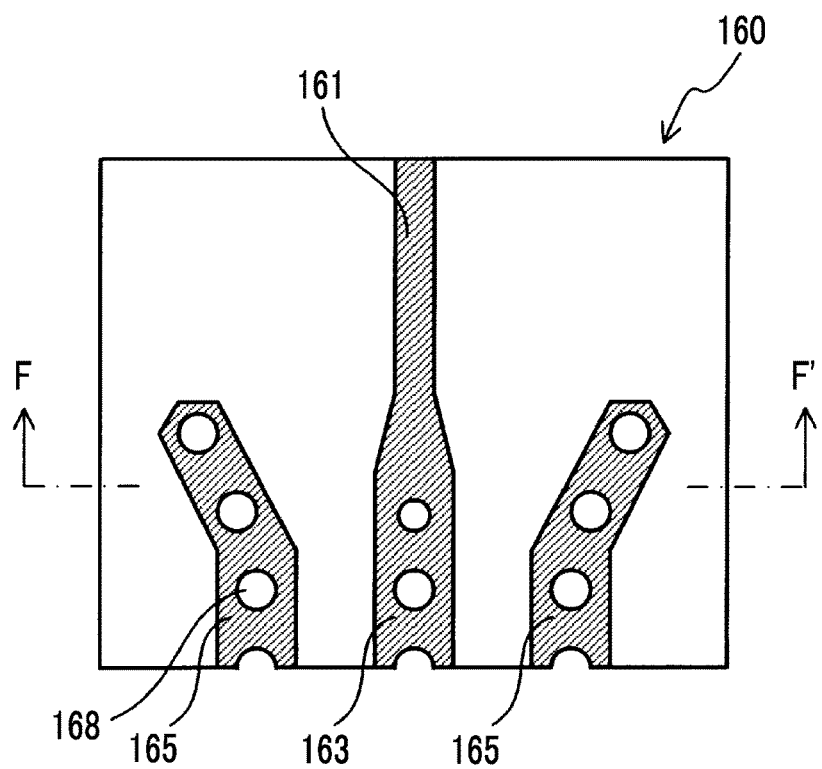
FIG. 15 is a view illustrating a back surface of a flexible printed circuit according to a seventh embodiment of the present invention.
Figure 16:
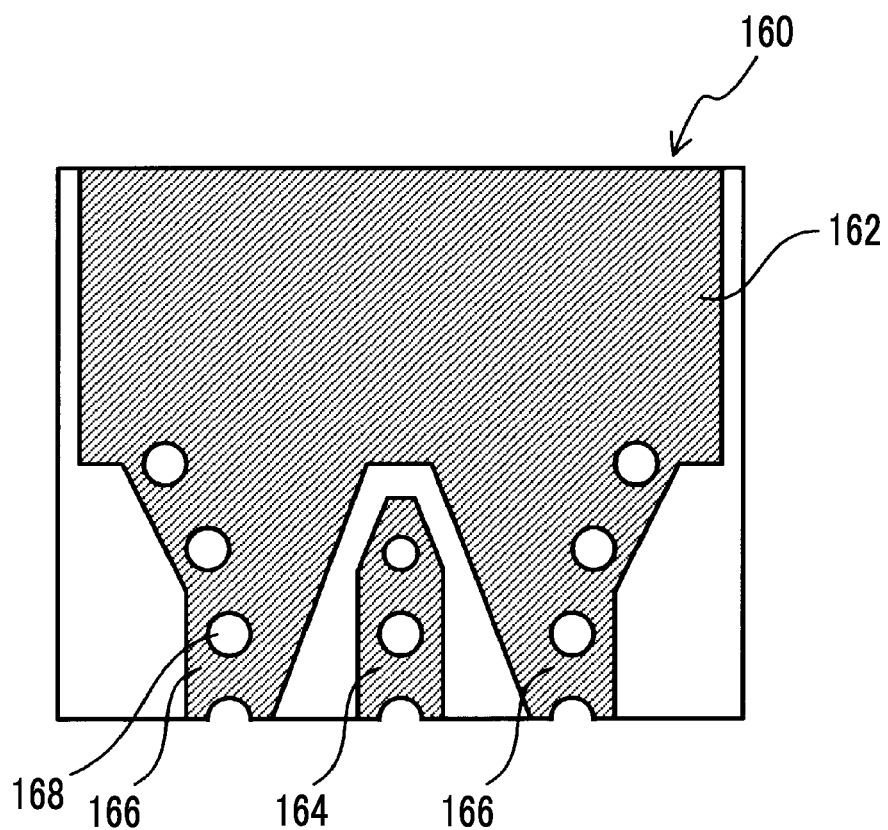
FIG. 16 is a view illustrating a front surface of the flexible printed circuit according to the seventh embodiment of the present invention.
Figure 17:
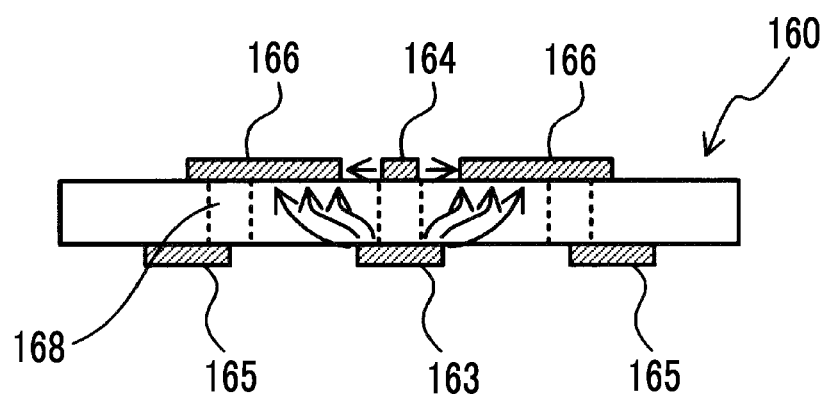
FIG. 17 is a view illustrating a cross section of the flexible printed circuit taken along one-dot chain line F-F' in FIG. 15.

FIG. 15 is a view illustrating a back surface of a flexible printed circuit 160 according to a seventh embodiment. FIG. 16 is a view illustrating a front surface of the flexible printed circuit 160 according to the seventh embodiment. FIG. 17 is a view illustrating a cross section of the flexible printed circuit 160 taken along one-dot chain line F-F' in FIG. 15.

In the seventh embodiment, a signal terminal 164 on the front surface including a ground electrode 162 is formed such that the width is gradually narrowed toward the end portion on the transmission line side in the vicinity of the end portion on the transmission line side. On the other hand, two ground terminals 166 on the same surface (front surface) are formed such that the gap therebetween is gradually narrowed toward the end portion on the transmission line side throughout its entirety in the length direction. Moreover, a ground terminal 165 on the back surface including a signal electrode 161 is formed such that the gap between the ground terminal 165 and a signal terminal 163 is gradually widened in the vicinity of the end portion on the transmission line side. Therefore, as illustrated in FIG. 17, lines of electric force toward the ground terminal 166 on the front surface from the signal terminal 163 on the back surface can be further increased. Accordingly, deterioration in high-frequency characteristics of the connection portion between the connection terminal and the transmission line can be further suppressed.

Hereinabove, the present invention has been described based on the embodiments. However, the present invention is not limited to the details described above, and the design can be suitably changed without departing from the gist of the present invention. In addition, it goes without saying that the effects are further enhanced by suitably combining each of the embodiments.

For example, in each of the embodiments described above, the transmission line on the flexible printed circuit has the microstrip line structure. However, the configuration is not limited thereto, and another line structure such as a coplanar line structure also having the ground electrode on the back surface may be adopted.

In addition, in each of the embodiments described above, the ground terminals are provided on both sides such that the signal terminal is interposed therebetween. However, a terminal structure in which the ground terminal is provided on only one side of the signal terminal may be adopted.

The present invention can be utilized in a flexible printed circuit which can be used as a connection interface with respect to an external electric circuit, and an optical device which includes the flexible printed circuit.

What is claimed is:

1. An optical device comprising:
an optical control element that controls a light wave by using a high-frequency signal; and
a flexible printed circuit that serves as a connection interface with respect to an external electric circuit,
wherein a high-frequency signal is supplied from the external electric circuit to the optical control element through the flexible printed circuit,
wherein the flexible printed circuit has a transmission line for a high-frequency signal, and a connection terminal for electrically connecting the transmission line to the external electric circuit,
wherein the transmission line has a signal electrode formed on one surface of the flexible printed circuit, and a ground electrode formed on the other surface of the flexible printed circuit,
wherein the connection terminal has signal terminals formed on both the surfaces of the flexible printed circuit and electrically connected to each other through a via hole, and ground terminals formed on both the surfaces of the flexible printed circuit and electrically connected to each other through a via hole,
wherein the signal terminal on the surface, on which the ground electrode is formed, is formed such that at least a width in an end portion on the transmission line side is narrower than a width of a part of the signal terminal on the surface, on which the signal electrode is formed, to be at the same position when the flexible printed circuit is seen in a plan view, and
wherein the ground terminal on the surface, on which the signal electrode is formed, is formed such that a gap between the ground terminal and the signal terminal on the same surface is widened toward the transmission line side.

2. The optical device according to claim 1, wherein the ground terminal on the surface, on which the ground electrode is formed, is formed such that a gap between the ground terminal and the signal terminal on the surface, on which the signal electrode is formed, when the flexible printed circuit is seen in a plan view is narrowed toward the transmission line side.

3. The optical device according to claim 1, wherein the ground terminals on each of the surfaces of the flexible printed circuit are formed such that the signal terminal on the same surface is interposed between the ground terminals.

4. The optical device according to claim 1, wherein the signal terminal on the surface, on which the signal electrode is formed, is formed such that the width is gradually narrowed toward the end portion on the transmission line side throughout its entirety in the length direction.

5. The optical device according to claim 1, wherein the signal terminal on the surface, on which the signal electrode is formed, is formed such that the width is narrowed in a linear way toward the end portion on the transmission line side in the vicinity of the end portion on the transmission line side.

6. The optical device according to claim 1, wherein the signal terminal on the surface, on which the signal electrode is formed, is formed such that the width is narrowed in a curved way toward the end portion on the transmission line side in the vicinity of the end portion on the transmission line side.

* * * * *